United States Patent
Tiemann

(10) Patent No.: US 7,073,562 B2
(45) Date of Patent: Jul. 11, 2006

(54) METHOD FOR PRODUCING A MONOCRYSTALLINE COMPONENT, HAVING A COMPLEX MOULDED STRUCTURE

(75) Inventor: Peter Tiemann, deceased, late of Witten (DE); by Iris Oltmanns, legal representative, Witten (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/486,606

(22) PCT Filed: Jul. 24, 2002

(86) PCT No.: PCT/EP02/08258

§ 371 (c)(1),
(2), (4) Date: Dec. 21, 2004

(87) PCT Pub. No.: WO03/016597

PCT Pub. Date: Feb. 27, 2003

(65) Prior Publication Data

US 2005/0120942 A1   Jun. 9, 2005

(30) Foreign Application Priority Data

Aug. 13, 2001  (EP)  ................... 01119452

(51) Int. Cl.
*B22D 27/04* (2006.01)

(52) U.S. Cl. ................... 164/122.2; 164/122.1

(58) Field of Classification Search ............. 164/122.1, 164/122.2
See application file for complete search history.

(56) References Cited

U.S. PATENT DOCUMENTS

| 4,804,311 A | | 2/1989 | Anderson et al. | |
| 5,275,227 A | * | 1/1994 | Staub | ............. 164/122.1 |

FOREIGN PATENT DOCUMENTS

GB  1264053  2/1972

* cited by examiner

*Primary Examiner*—Kuang Y. Lin

(57) ABSTRACT

The invention relates to a method for producing a monocrystalline component, having a complex moulded structure with different structure parts, from a molten metal. According to the method, said molten metal is located in a negative mould, corresponding to the moulding structure and said negative mould moves with the formation of a solidification front on a temperature drop, which is adapted to the crystallization speed of the molten metal and which includes the melting point. Said method is characterized in that at least one of the structure parts of the moulded structure experiences an individual temperature drop. If the solidification front has to grow through a structure part, which is inappropriately oriented in relation to the solidification front, said structure part or zone can experience an individual temperature drop. This enables monocrystalline components, having a complex moulded structure, to be produced in a reliable and economic manner.

13 Claims, 2 Drawing Sheets

METHOD FOR PRODUCING A MONOCRYSTALLINE COMPONENT, HAVING A COMPLEX MOULDED STRUCTURE

CROSS REFERENCE TO RELATED APPLICATIONS

This application is the US National Stage of International Application No. PCT/EP02/08258, filed Jul. 24, 2002 and claims the benefit thereof. The International Application claims the benefits of European application No. 01119452.9 EP filed Aug. 13, 2001, both of the applications are incorporated by reference herein in their entirety.

FIELD OF INVENTION

The invention relates to a process for producing a single-crystal component with a complex shape structure and comprising various structural parts formed from a metal melt, the metal melt being introduced into a negative mold which correlates with the shape structure and the negative mold being moved through a negative temperature gradient, which is matched to the crystallization rate of the metal melt and includes the melting point, so as to form a solidification front.

BACKGROUND OF INVENTION

The production of single-crystal components is becoming increasingly important in order to allow ever further increases in performance to be achieved, in particular in the field of turbines. Blades and vanes of turbines, such as aircraft engine turbines or gas turbines for generating energy in power plants, are exposed to high loads. As the performance, efficiency and emissions of gas turbines continue to improve, the thermal and therefore mechanical boundary conditions imposed on turbine guide vanes in the first stage(s) are becoming increasingly extreme. Particular loads occur, for example, as a result of the platforms being made increasingly thin, as a result of a changing working medium and as a result of reduced external cooling on account of cooling leaps in the passage edge region of the gas turbine. A further improvement in the performance in terms of materials properties is required, since to reduce the consumption of cooling air in the gas turbine, the number of vanes in the ring needs to be reduced in favor of larger-sized vanes. To make it possible to cope with these boundary conditions, it is desirable to change material or to change material structure towards single crystals, as in part already being attempted in the rotor blade area of gas turbines. Components which are formed from single crystals only have grain boundaries which do not cause any significant weak points in the material compared to the material as a whole as temperatures rise.

The production of single-crystal components has already been known for many years. To do this, first of all molten material is poured into a casting mold. The casting mold has the negative shape structure of the component which is to be produced and is therefore also referred to as a negative mold. When the molten material solidifies in the negative mold, it acquires the desired shape structure of the component. The shape structure generally comprises a plurality of regions, known as structural parts. The casting mold holding the molten material is located inside a furnace, so that the molten material is heated further and remains liquid. To produce single crystals, the negative mold is slowly moved out of the furnace, so that the solidification process begins outside the furnace and the solidification front follows the negative temperature gradient. To provide the single crystal with the desired orientation, a cochleate tip of the casting mold, filled with molten material, is initially solidified from the outermost tip. The cochleate tip is referred to as the selection helix. The helix is used to select the crystal growth direction. The single crystal therefore forms the incipient solidification front and in the desired case continues to grow through the entire negative mold. The negative mold has to be passed through the negative temperature gradient at a speed which is matched to the crystallization rate of the metal. If the molten material is passed through the negative temperature gradient more quickly than the crystal growth rate, new creation occurs and additional crystals which have a different orientation than the desired single crystal are formed. If this occurs, the component is faulty and can no longer be used. In particular the production of single crystal turbine guide vanes with greatly overhanging platforms is very difficult. The turbine guide vanes comprise a plurality of structural parts which form the shape structure of the component. A particular problem is the transition from a platform to a profiled-section part and vice versa. The platform forms the region of the guide vane which in the turbine lies parallel to and flush with the inner radial surface of the guide vane carrier, while the profiled-section parts are firstly the main vane section and secondly the connecting element between the guide vane carrier and the guide vane. A problem with this arrangement is that the plane normal to the platform is virtually perpendicular to the plane normal to the profile. The growth direction of the single crystal is generally selected in such a way that it runs substantially along a longitudinal axis of the profile-section part and parallel to the plane normal to the platform. The planes are almost substantially perpendicular to one another and extend in different directions. Accordingly, it is necessary to realize a virtually instantaneous change in the solidification front surface from the small surface of the profiled-section part to the substantially wider surface of the platform. In this region, it is necessary to respond with a drop in the rate at which the casting mold in the furnace is lowered from the heated region into the unheated region, or to provide a corresponding number of grain-maintaining means in the form of a diversion from the profiled-section part into the outer platform regions. The effects of both options are very difficult to predict and moreover are subject to fluctuations in the process, so that the discharge rate or productivity drops. Hitherto, it has been attempted to solve this problem by searching for an optimum orientation with respect to the negative temperature gradient for the platform. By tilting the casting mold in the furnace in order to optimize the orientation of the platform with respect to the negative temperature gradient, the problem is improved in one direction, since the solidification front then fans open along a ramp into the platform, so that the change in cross-section is attenuated. Despite this, a right-angled connection still remains. A further problem is that of bringing the single crystal which has fanned out in the platform back together into a narrower structural part of the guide vane, which once again presents the problem of the right-angled connection with a spontaneous change in the surface of the solidification front.

These and similar problems also manifest themselves in numerous instances for other components of other shape structures.

SUMMARY OF INVENTION

Therefore, the invention is based on the object of providing a process which allows single crystal components with a complex shape structure to be produced on a reliable and economic footing.

To achieve this object, it is proposed to produce an individual negative temperature gradient for at least one of the structural parts of the shape structure.

A further advantageous feature of the invention provides for an individual solidification front to be formed with an individual negative temperature gradient. In this way, the negative mold is passed through the negative temperature gradient in the customary way. When the solidification front finally has to continue to grow through a structural part which is oriented unfavorably with respect to the solidification front, a dedicated negative temperature gradient can be generated for this structural part or region. This negative temperature gradient can be optimally matched to the requirements of the particular structural part, independently of the main negative temperature gradient. For example, in the case of the turbine guide vane, the magnetic field and therefore the negative temperature gradient of the induction furnace can be varied in such a way that a shaped solidification front is formed instead of a planar solidification front. Accordingly, on the one hand a negative temperature gradient which forms a planar solidification front perpendicular to the longitudinal axis of the profiled-section part is formed in the region of the latter, and on the other hand a negative temperature gradient which causes the solidification front to bend into the platform is produced, and the solidification front progresses through the platform over its height rather than over its width, as has hitherto been the case. A further advantage of this configuration is that if the solidification front bends off toward the sides and grows into the edge regions of the platform, it can also end there and does not have to be guided back toward the profiled-section part. Hitherto, it has always been necessary for the solidification front which has fanned out into the width of the platform to be guided back into the profiled section on reaching the end of the solidification front. As a result, the problems of difficult transitions in cross-section and of multiple grains being formed are eliminated. In this way, structural parts can be cooled or heated in completely different ways. It is fundamentally possible for each structural part to be assigned an individual negative temperature gradient in order thereby for extremely complex components to be produced as single crystals.

The invention is advantageously configured in such a manner that different individual negative temperature gradients advance at different speeds. A process of this type enables certain structural parts to be passed through the negative temperature gradient less quickly than others. By way of example, if a plurality of heating elements are used, the heating elements can be moved along the negative mold independently of one another. In this way, the negative temperature gradient is advanced at different speeds in the different structural elements. In the case of production of a turbine guide vane, for example, it may be necessary for the solidification front which is bent into the platform to be allowed to advance slightly more slowly than the solidification front which is simultaneously advancing inside the profiled-section part. This makes it possible to ensure optimum single crystal formation in the platform and to achieve the maximum possible speed of advancing solidification in the profiled-section part. There is no longer any need to compromise between individual regions. Each region or structural part is given its own individual compromise between solidification rate and reliability of formation of the single crystal.

According to a further advantageous configuration of the invention, individual negative temperature gradients of different structural parts have individual orientations with respect to the crystal growth direction. This allows the solidification front to be oriented in any desired way with respect to the growth direction and with respect to the corresponding structural part. In the example of the production of a turbine guide vane, accordingly, although the growth starting from the transition to the profiled-section part will grow into the width, the solidification front is not oriented perpendicular to the growth direction. The solidification front therefore has an angle of inclination of less than 90° with respect to the growth direction.

The invention is particularly advantageous on account of the fact that the different crystal growth directions of the different structural parts substantially follow a main crystal growth direction. The term main crystal growth direction is to be understood as meaning the direction which is substantially followed by the crystal growth. In the prior art, the entire crystal growth has taken place in one direction, specifically the opposite direction to that in which the negative mold is guided out of the furnace. With the invention, it is possible to achieve numerous different growth directions by creating different growth directions in different negative temperature gradients. For example, it would be possible for a star-shaped, single-crystal component to be allowed to grow outward in a star shape from the center. An individual negative temperature gradient which progresses toward the tips of the arms of the star could be produced for each star arm of the component. A main crystal growth direction cannot be defined for a component of this type. The advantage of a main crystal growth direction resides in the high degree of certainty that no additional grains will be formed; the risk of this occurring increases when the difference between the crystal growth directions in the transition from one structural part to another increases beyond a certain angle. Therefore, according to the invention it is proposed for the different crystal growth directions to deviate by no more than 20° from the main crystal growth direction. However, the angle given here is not to be considered as a specific restriction. Larger angles can also be realized given sufficiently sensitive process control.

According to the invention, it is advantageously proposed for the individual negative temperature gradient to be formed by a heating element which can be actuated independently. The negative temperature gradient for the main crystal growth direction can most easily be produced by means of a correspondingly high-powered heating element, whereas the individual negative temperature gradient for the different structural parts can be generated using smaller heating elements. The term actuable heating elements is to be understood as encompassing both heating elements which can be physically displaced and/or heating elements whose output of heat can be regulated. It is particularly advantageous for an induction coil and/or a radiator to be used as heating element. For example, a suitable heat source can be selected according to the specific requirements.

According to a further advantageous configuration of the invention, the negative temperature gradient is influenced by an insulation body. This means that not only is it possible to influence the negative temperature gradient by means of heating bodies, but also by means of insulation bodies. Even stronger negative temperature gradients can be produced with the aid of insulation bodies than if heating elements alone are used.

The process is particularly advantageously such that it is used to produce a turbine guide vane.

BRIEF DESCRIPTION OF THE DRAWINGS

Further advantages and features of the invention will become clear from the description of the figures, in which.

DETAILED DESCRIPTION OF INVENTION

Figure 1:
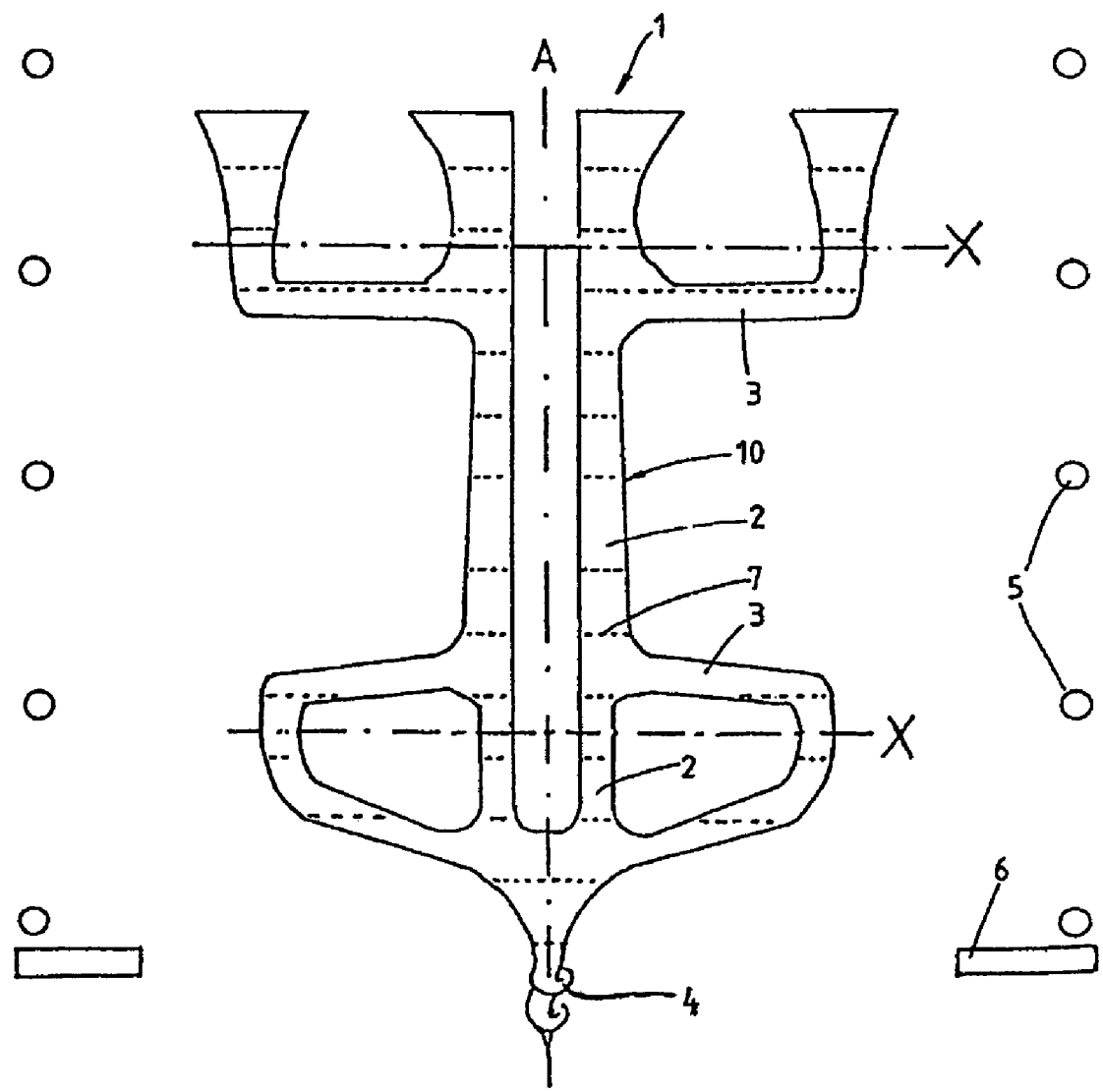
FIG. 1 diagrammatically depicts a section through a turbine guide vane, including the solidification front profile as produced in a conventional process, FIG. 2 diagrammatically depicts a section through a turbine guide vane, including the solidification front profile as produced by the process of the invention.

FIG. 1 shows a single-crystal casting 1 from which two turbine guide vanes 10 can be obtained by cutting along cut lines X. Section line A indicates the longitudinal axis of the casting 1, which lies parallel to the longitudinal axis of the bearing profile-section parts 2. The structural regions which are known as platforms 3 lie substantially perpendicular to the structural regions referred to as profiled-section parts. Since FIG. 1 shows a section through a turbine guide vane, the planes extend perpendicular to the plane of the drawing. The selection helix 4 is used to form a single crystal which is then supposed to grow continuously through the entire component 1, so that single-crystal turbine guide vanes 10 are obtained. Before solidifying, the turbine guide vane 10 is contained in the casting mold in the form of a liquid melt. At this time, the casting mold is inside an induction furnace 5, only the coil 5 of which is diagrammatically indicated. The induction furnace 5 keeps the melt liquid. To form a single crystal, the casting mold is moved downward out of the induction furnace 5 at a speed which is matched to the crystal growth rate of the metal. First of all, once the selection helix 5 has dropped below the solidification temperature, a single crystal is formed, and this crystal continues to grow through the casting mold as the casting mold is lowered further. To produce a strong negative temperature gradient, it is customary for diaphragms 6 to be arranged beneath the induction furnace 5. Since the induction acts primarily inside the coil 5 and the magnetic field loses its intensity very quickly outside the coil, the solidification takes place as far as possible in a plane perpendicular to the direction of movement of the casting mold. The solidification front 7 at various times is indicated by dashed lines in FIG. 1. As the solidification front 7 advances, it is subject to abrupt changes in cross-section in the virtually right-angled transitions between the profiled-section structural parts 2 and the platform structural parts 3. Here, there is a high risk of multiple grains being formed, and this in turn makes the turbine guide vane 1 unusable.

Figure 2:
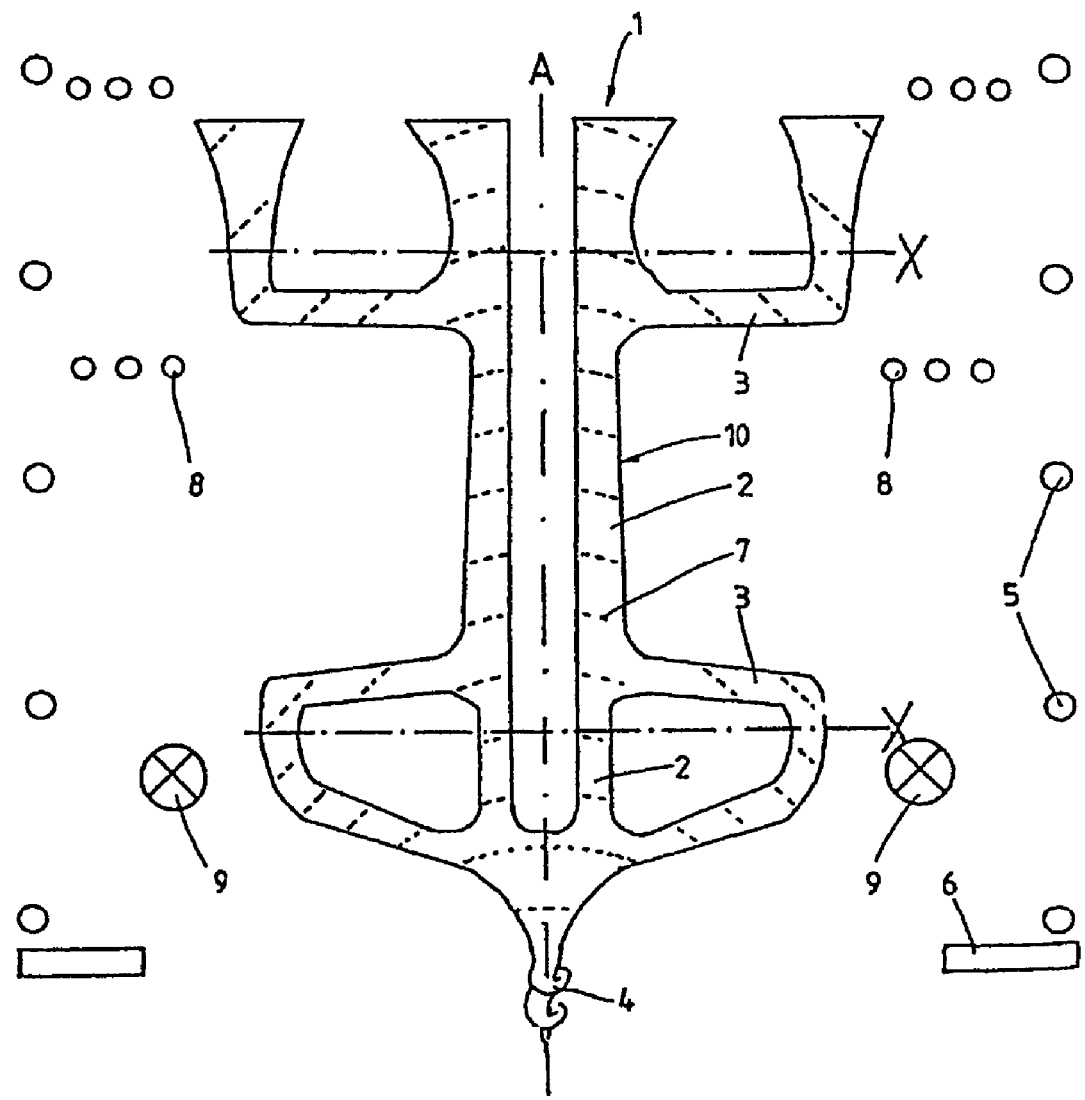

FIG. 2 shows the same component 1 as FIG. 1. The difference, however, is in the induction coils 8 and radiator 9 used in addition to the induction furnace 5 which has already been described above. These ensure that the negative temperature gradient is not planar but rather is in accordance with the invention. In this way, an individual negative temperature gradient is produced for the different structural parts 2, 3 of the shape structure of the component 1. In this example, the negative temperature gradient is approximately semicircular and is merely intended to be a schematic representation of one possible form of negative temperature gradient. This means that the crystal grows through the structural parts which are located in the vicinity of the longitudinal axis A with a solidification front running virtually in the parallel direction. Therefore, the solidification in this region does not differ significantly from the crystal growth shown in FIG. 1. The single crystal grows through the structural parts or regions further away from the longitudinal axis A with a solidification front 7 which has a growth direction which is inclined away from the main crystal growth direction and from the longitudinal axis A. This individual, different crystal growth direction should preferably not deviate from the main crystal growth direction by more than 20°. In this casting, the main crystal growth direction is along the longitudinal axis A, since this is the most significant crystal growth direction. The individual negative temperature gradients in the platforms 3 are generated by the induction coils 8 and the radiators 9. On account of the elevated temperature which is generated by these heating elements 8, 9 exclusively at the regions which are further away from the longitudinal axis A, the solidification front 7 moves from the inside outward, so that the solidification front 7 does not move through the platform over its width, but rather tends to move in the height direction. The term height is to be understood as meaning the extent parallel to the longitudinal axis A. The term width is to be understood as meaning the extent perpendicular to the longitudinal axis A. The separate heating elements 8, 9 can be actuated individually. For example, the heat which they generate may be controllable and/or their position may be displaceable. It will be obvious that it is also possible to generate individual negative temperature gradients for a plurality of structural parts using just one heating element.

The invention claimed is:

1. A process for producing a single-crystal structural component with a complex shape, comprising:
   melting a metal;
   introducing the metal melt into a mold which correlates with the shape of the component;
   moving the mold through a temperature gradient matched to the crystallization rate of the metal melt and including the melting point; and
   forming a solidification front on the metal melt, wherein an individual temperature gradient is generated for a plurality of structural portions of the component, wherein the individual temperature gradient is formed by an independently actuable heating element.

2. The process as claimed in claim 1, wherein a plurality of temperature gradients form a plurality of solidification fronts.

3. The process as claimed in claim 1, wherein different individual temperature gradients are advanced at different speeds.

4. The process as claimed in claim 1, wherein individual temperature gradients of different portions of the components have individual orientations with respect to a crystal growth direction of the metal melt.

5. The process as claimed in claim 4, wherein the different crystal growth directions of the different structural parts substantially follow a main crystal growth direction.

6. The process as claimed in claim 4, wherein the different crystal growth directions deviate by no more than 20° from the main crystal growth direction.

7. The process as claimed in claim 1, wherein an induction coil and/or a radiator is used as the heating element.

8. The process as claimed in claim 7, wherein the temperature gradient is influenced by an insulation body.

9. The process as claimed in claim 1, wherein the component is a turbine vane.

10. The process as claimed in claim 1, wherein the temperature gradient is a negative temperature gradient.

11. A process for producing a single-crystal structural component with a complex shape, the process comprising:
   introducing a metal melt into a mold which correlates with the shape of a component and comprises a first region extending in a first direction along a longitudinal axis and a second region extending at an angle inclined with respect to the longitudinal axis; and
   introducing into the metal melt a first negative temperature gradient to form a first solidification front moving through the first region in the first direction and a second negative temperature gradient to form a second solidification front moving through the second region in the second direction effective to form the component in a single crystal growth, wherein the component is a turbine blade, and further comprising the first negative temperature gradient causing the first solidification front to progress along a longitudinal axis of an airfoil portion of the blade and the second negative temperature gradient causing the first solidification front to bend into a platform section of the blade to form the second solidification front that progresses through the platform substantially perpendicular to the longitudinal axis.

12. The process of claim 11, wherein one of the solidification fronts is a planar solidification front and another of the solidification fronts is a shaped solidification front.

13. The process of claim 11, wherein the first and second solidification fronts advance at different speeds.

* * * * *